US 10,752,187 B2

(12) United States Patent
Kakimi et al.

(10) Patent No.: US 10,752,187 B2
(45) Date of Patent: Aug. 25, 2020

(54) CASING, ELECTRICAL CONNECTION BOX, AND WIRE HARNESS

(71) Applicant: YAZAKI CORPORATION, Tokyo (JP)

(72) Inventors: Takaaki Kakimi, Makinohara (JP); Tatsuhiko Ikeda, Makinohara (JP)

(73) Assignee: YAZAKI CORPORATION, Tokyo (JP)

(*) Notice: Subject to any disclaimer, the term of this patent is extended or adjusted under 35 U.S.C. 154(b) by 0 days.

(21) Appl. No.: 16/375,024

(22) Filed: Apr. 4, 2019

(65) Prior Publication Data

US 2019/0344730 A1   Nov. 14, 2019

(30) Foreign Application Priority Data

May 8, 2018   (JP) .................... 2018-089714

(51) Int. Cl.
*H01R 9/00*      (2006.01)
*B60R 16/02*     (2006.01)

(52) U.S. Cl.
CPC .............. *B60R 16/0207* (2013.01)

(58) Field of Classification Search
CPC ... H02G 3/02; H02G 3/04; H02G 3/14; B60R 16/02; B60R 16/0207
USPC .............. 174/72 R, 74 R, 84 R, 92
See application file for complete search history.

(56) References Cited

U.S. PATENT DOCUMENTS

| 4,502,609 A * | 3/1985 | Christatos ............ H05K 5/03 220/3.8 |
| 5,266,741 A * | 11/1993 | Butler ............ H02G 15/117 174/41 |
| 7,078,625 B1 * | 7/2006 | Rebers ............ H01Q 1/12 174/92 |
| 2007/0141893 A1 * | 6/2007 | Pizzi ............ H01R 9/2416 439/441 |
| 2008/0292249 A1 * | 11/2008 | Kimura ............ G02B 6/4448 385/90 |

FOREIGN PATENT DOCUMENTS

| EP | 0420255 A1 | 4/1991 |
| JP | 3-91678 U | 9/1991 |
| JP | 11-307954 A | 11/1999 |
| JP | 2001-69644 A | 3/2001 |
| JP | 2014-143877 A * | 8/2014 ........... H02G 3/14 |
| JP | 2014-143877 A | 8/2014 |

* cited by examiner

*Primary Examiner* — William H. Mayo, III
(74) *Attorney, Agent, or Firm* — Sughrue Mion, PLLC

(57) ABSTRACT

A wire harness arranged in a vehicle has an electrical connection box at the terminal thereof. The electrical connection box includes an electronic component block to which a plurality of electronic components are assembled and a casing to be an assembly destination of the electronic component block. The casing has a structure in which an upper opening portion surrounded by an edge of a frame peripheral wall is rotatably moved and covered by a separate upper cover. In the casing, a protrusion is formed on one of the frame peripheral wall or the upper cover. On the other thereof, a protrusion engaging portion is formed with respect to the protrusion. The protrusion is formed so as to be engaged with the protrusion engaging portion in an inserted state. In such protrusion, a projection is integrally formed so as to at least prevent the upper cover from coming off.

14 Claims, 13 Drawing Sheets

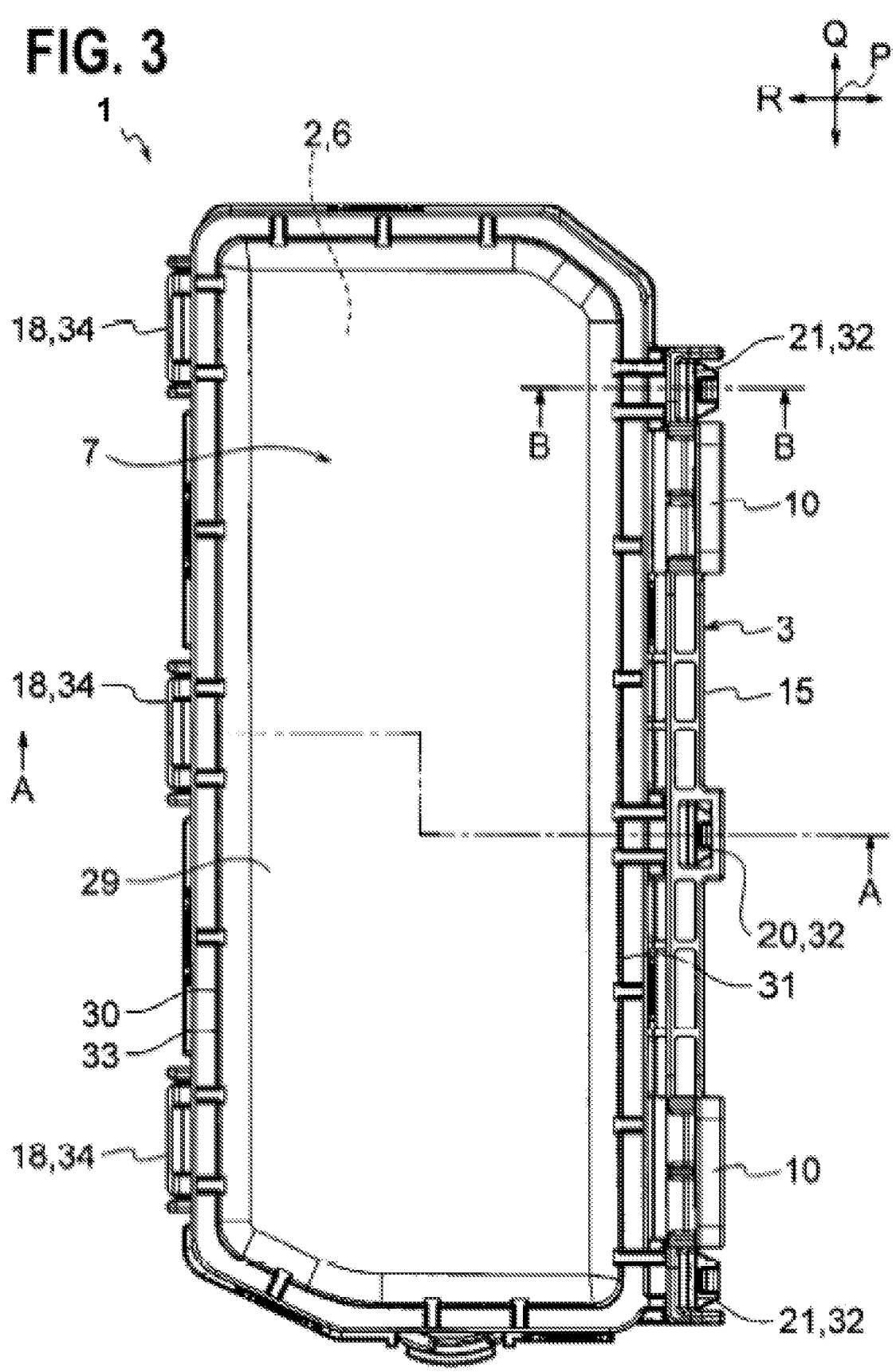

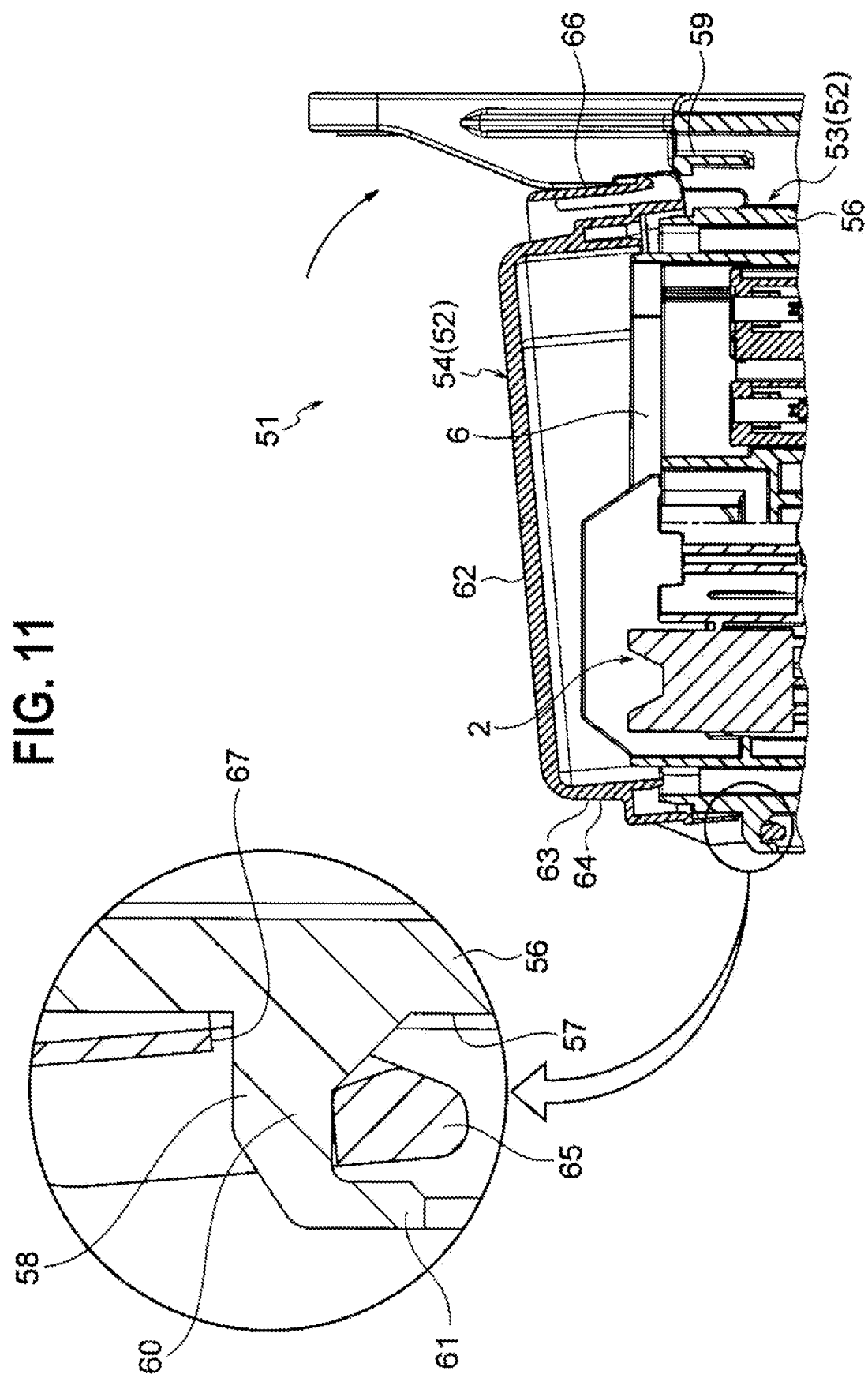

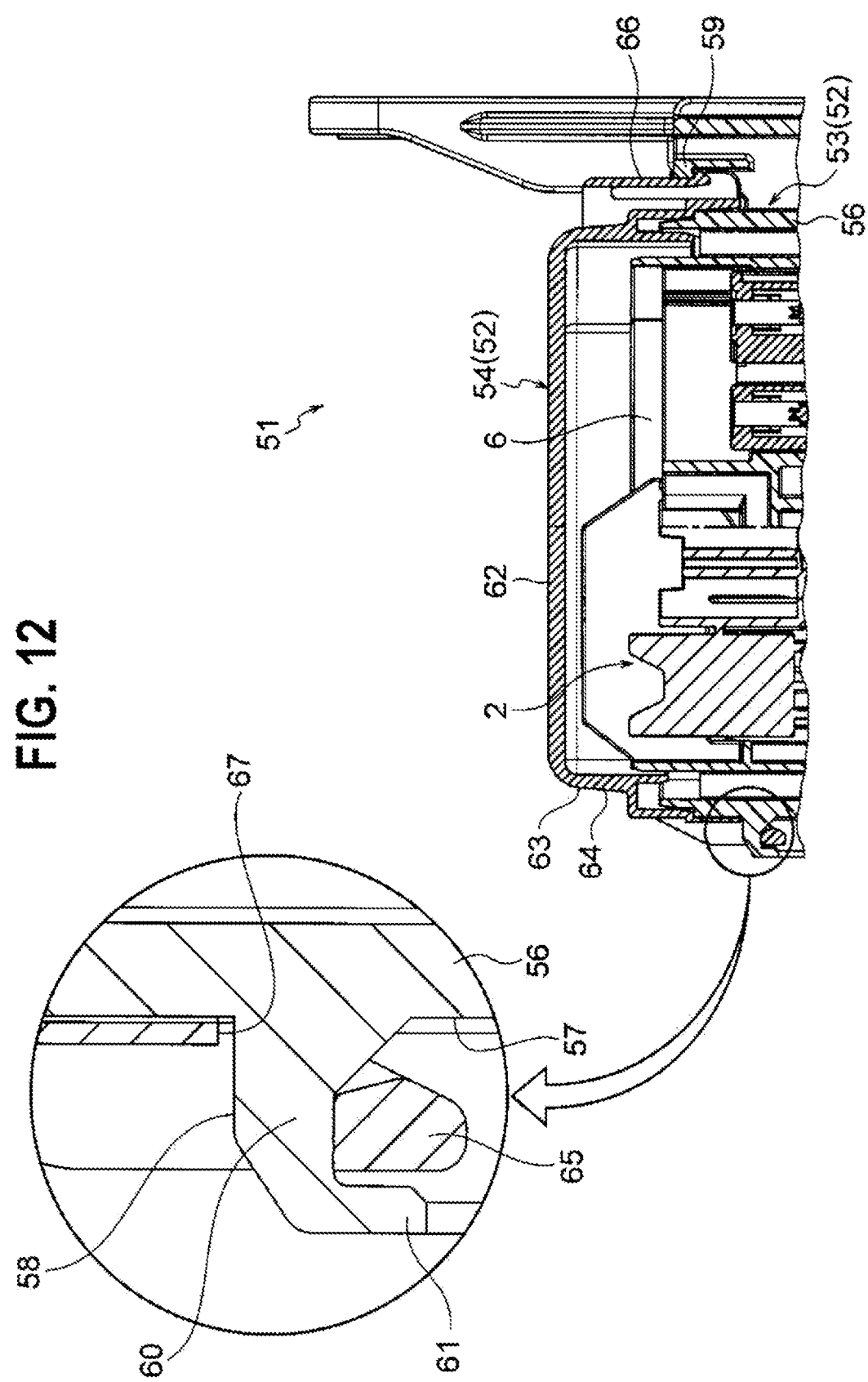

CASING, ELECTRICAL CONNECTION BOX, AND WIRE HARNESS

CROSS-REFERENCE TO RELATED APPLICATIONS

This application is based on and claims priority under 35 USC 119 from Japanese Patent Application No. 2018-089714 filed on May 8, 2018, the contents of which are incorporated herein by reference.

TECHNICAL FIELD

The present invention relates to a casing including a frame peripheral wall having an opening portion and a cover covering the opening portion by rotational movement. The present invention also relates to an electrical connection box including the casing and an electronic component block and a wire harness.

BACKGROUND ART

An electrical connection box to be mounted on an automobile is configured to include an electronic component block and a casing for accommodating the electronic component block (for example, see Patent Document 1). The casing is configured to include a frame having a frame peripheral wall, and a cover. The cover is formed as a member that covers an opening portion surrounded by the edge of the frame peripheral wall. The casing is configured such that the opening portion is covered by rotational movement of the cover and the locking portions of the frame and the cover are fitted to each other to complete the assembly thereof. Protrusions are formed on the cover of the casing for rotational movement of the cover. On the frame peripheral wall, protrusion engaging portions are formed so as to be engaged when the protrusions of the cover are inserted.

PRIOR ART DOCUMENT

Patent Document

Patent Document 1: JP-A-2014-143877

SUMMARY OF INVENTION

In the above related art, there is a possibility that the cover may come off the frame, for example, when the cover rotates and moves.

The present invention has been made in view of the above circumstances, and an object thereof is to provide a casing capable of preventing a cover from coming off. It is also an object to provide an electrical connection box and a wire harness including the casing in the configuration thereof.

In order to achieve the above object, the casing of the present invention according to a first aspect has a frame peripheral wall on which an opening portion is formed at an edge; and a cover that is a separate component from the frame peripheral wall and covers the opening portion by rotational movement. A protrusion protruding outward is formed on one side portion of the cover to be disposed in accordance with a position of a rotation center related to the rotational movement, a protrusion engaging portion to be engaged by inserting the protrusion is formed on one side portion of the frame peripheral wall, and the protrusion is integrally formed with a projection that is hooked on the protrusion engaging portion in a direction of pulling out from the protrusion engaging portion.

According to the present invention having the above features of the first aspect, for example, during the rotational movement at the time of cover assembly, even if the protrusion of the cover is about to fall off the protrusion engaging portion of the frame peripheral wall due to some reason, the projection formed on the protrusion is hooked on the protrusion engaging portion to restrict the falling off. As a result, it is possible to prevent the cover from coming off.

Further, in the casing of the present invention according to a second aspect, a cover side holding surface for holding is formed in the protrusion and is disposed between one side portion of the cover and the projection, and a peripheral wall side holding surface for holding that allows the cover side holding surface to be contacted is formed in the protrusion engaging portion.

According to the present invention having the above features of the second aspect, since the cover side holding surface formed on the protrusion of the cover comes into surface contact with the peripheral wall side holding surface formed on the protrusion engaging portion of the frame peripheral wall so that stable cover holding is performed, it is possible to enhance the effect of preventing the cover from coming off according to the first aspect.

Further, in the casing of the present invention according to a third aspect, the protrusion engaging portion is formed so that the peripheral wall side holding surface is disposed at a position substantially flush with the edge of the frame peripheral wall.

According to the present invention having the above features of the third aspect, even if the cover is about to come off the frame peripheral wall due to some reason after the opening portion of the frame peripheral wall is covered with the cover, since the cover side holding surface formed on the protrusion of the cover has a disposition relationship such that the cover side holding surface surely comes into surface contact with the peripheral wall side holding surface formed on the protrusion engaging portion of the frame peripheral wall, it is possible to further enhance the effect of preventing the cover from coming off. The above disposition relationship of the third aspect may be made more effective in the case of packing which is a constituent feature of a fourth aspect below is provided (the cover side holding surface is pressed against the peripheral wall side holding surface by the elastic restoring force by the packing, and as a result, the holding state becomes stable and better).

Furthermore, in the casing of the present invention according to a fourth aspect, an annular packing groove is formed in the cover, and a packing which is elastically deformable by being pressed against the edge is assembled to the packing groove.

According to the present invention having the above features of the fourth aspect, since the packing is included as the configuration of the casing, it is possible to provide the casing with waterproof capability (airtightness) secured. As a result, it is possible to prevent the cover from coming off in the casing that ensures this waterproof capability (airtightness). According to the present invention, the holding state of the cover described above in the third aspect may be made stable and better.

Moreover, in the casing of the present invention according to a fifth aspect, the projection and the protrusion engaging portion are also formed as positioning portions for determining positions of the edge and the packing at the time of the rotational movement.

According to the present invention having the above features of the fifth aspect, the projection formed on the protrusion of the cover and the protrusion engaging portion formed on the frame peripheral wall function as positioning portions, it is possible to press the edge of the frame peripheral wall in accordance with the center position of the packing, and as a result, it is possible to reliably ensure waterproof capability (airtightness).

Further, in the casing of the present invention according to a sixth aspect, a plurality of the protrusions and the protrusion engaging portions are formed in the casing.

According to the present invention having the above features of the sixth aspect, since the protrusion and the protrusion engaging portion 13 are engaged at a plurality of positions, it is possible not only to make it difficult for the cover to come off, but also to enhance the holding state of the cover, thereby improving the waterproof capability (airtightness).

Further, in order to solve the above problem, a casing of the present invention according to a seventh aspect includes a frame peripheral wall on which an opening portion is formed at an edge; and a cover that is a separate component from the frame peripheral wall and covers the opening portion by rotational movement. A protrusion protruding outward is formed on one side portion of the frame peripheral wall to be disposed in accordance with a position of a rotation center related to the rotational movement, a protrusion engaging portion to be engaged by being inserted into the protrusion is formed on one side portion of the cover, and the protrusion is integrally formed with a projection to be hooked on the protrusion engaging portion in a direction of pulling out from the protrusion engaging portion.

According to the present invention having the above features of the seventh aspect, for example, during the rotational movement at the time of cover assembly, even if the protrusion engaging portion of the cover is about to fall off the protrusion of the frame peripheral wall due to some reason, the projection formed on the protrusion is hooked on the protrusion engaging portion to restrict the falling off. As a result, it is possible to prevent the cover from coming off.

Furthermore, in order to solve the above problem, a casing of the present invention according to an eighth aspect includes a frame peripheral wall on which an opening portion is formed at an edge; and a cover which is a separate component from the frame peripheral wall and covers the opening portion. Locking portions as fitting portions are formed on one side portion of the frame peripheral wall and one side portion of the cover, respectively. A protrusion protruding outward is formed on another side portion to be the opposite side of one side portion of the frame peripheral wall, a protrusion engaging portion that is elastically deformable so as to climb over the protrusion and is engaged by being inserted into the protrusion is formed on another side portion to be the opposite side of one side portion of the cover, and the protrusion is integrally formed with a projection to be hooked on the protrusion engaging portion in a direction of pulling out from the protrusion engaging portion.

The present invention having the above features of the eighth aspect corresponds to, for example, a case where the frame peripheral wall and the cover are fitted via the locking portions, but the protrusion engaging portion of the cover comes off the protrusion of the frame peripheral wall from the beginning (from the time of assembling) for some reason or corresponds to a case where the cover is assembled without rotating and moving the cover. In the present invention, even if the protrusion engaging portion is about to fall off the protrusion after the cover is knocked and the protrusion engaging portion is elastically deformed by the action so as to climb over the protrusion, the projection may be hooked on the protrusion engaging portion. As a result, the falling off is restricted, and the coming off of the cover is prevented.

Furthermore, in order to solve the above problem, an electrical connection box of the present invention according to a ninth aspect includes an electronic component block to which a plurality of electronic components are assembled; and the casing described above to be an assembly destination of the electronic component block.

According to the present invention having the above features of the ninth aspect, the effect of the casing may be obtained, and as a result, it is possible to provide a better electrical connection box with high reliability.

Moreover, in order to solve the above problem, a wire harness wired to a vehicle of the present invention according to a tenth aspect includes the electrical connection box according to the ninth aspect.

According to the present invention having the features of the tenth aspect, it is possible to provide a highly reliable and better wire harness which prevents the cover from coming off in the electrical connection box.

According to the casing of the present invention, it is possible to prevent the cover from coming off. According to the electrical connection box and the wire harness of the present invention, it is possible to provide a highly reliable and better product.

BRIEF DESCRIPTION OF DRAWINGS

FIG. 1A is an external perspective view, and FIG. 1B is an external perspective view illustrating a position of a rotation center of a cover (Example 1);

FIG. 3 is a plan view of the electrical connection box;

FIG. 4A is a front view of a protrusion engaging portion in the middle of three protrusion engaging portions, FIG. 4B is a cross-sectional view taken along the line C-C of FIG. 4A, FIG. 4C is a front view of a protrusion engaging portion at the left end among the three protrusion engaging portions, and FIG. 4D is a cross-sectional view taken along the line C-C of FIG. 4C;

FIG. 5A is a perspective view, and FIG. 5B is a cross-sectional view of FIG. 5A;

FIGS. 8A and 8B are cross-sectional views taken along the line B-B of FIG. 3, wherein FIG. 8A is a view at the start of cover rotation, and FIG. 8B is a view when the cover is fitted);

FIG. 9A is an external perspective view, and FIG. 9B is a plan view (Example 2);

FIG. 10A is a perspective view of the protrusion and the protrusion engaging portion, FIG. 10B is a perspective view of the protrusion, and FIG. 10C is a perspective view of the protrusion engaging portion;

FIG. 11 is a cross-sectional view taken along the line D-D of FIG. 9B (a view in the middle of cover rotation, an enlarged view of the main part inside the circle);

FIG. 12 is a cross-sectional view taken along the line D-D of FIG. 9B (a view when the cover is fitted, an enlarged view of the main part inside the circle); FIG. 13A is a cross-sectional view, FIG. 13B is a cross-sectional view of a protrusion and a protrusion engaging portion before knocking-in, and FIG. 13C is a cross-sectional view of the protrusion and the protrusion engaging portion after knocking-in (Example 3).

DESCRIPTION OF EMBODIMENTS

A wire harness wired to a car has an electrical connection box at the terminal thereof. The electrical connection box is configured to include an electronic component block to which a plurality of electronic components are assembled and a casing to be an assembly destination of the electronic component block. The casing has a structure in which an opening portion surrounded by an edge of a frame peripheral wall is rotatably moved and covered by a separate cover. Protrusions are formed on either the frame peripheral wall or the cover in the casing. On the other side, protrusion engaging portions are formed with respect to the protrusions. The protrusions are formed so as to be engaged with the protrusion engaging portions in an inserted state. In such protrusions, projections for at least preventing the cover from coming off are integrally formed.

Example 1

Figure 1A:
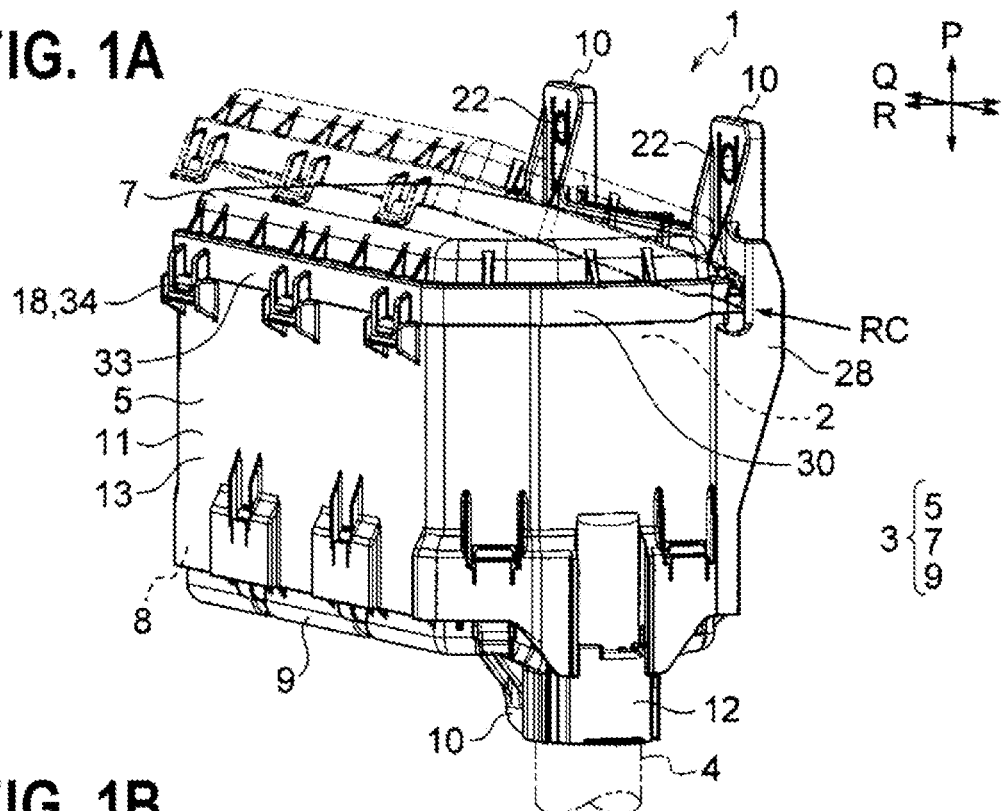
FIGS. 1A and 1B are views illustrating an embodiment of an electrical connection box including a casing of the present invention.
Figure 1B:
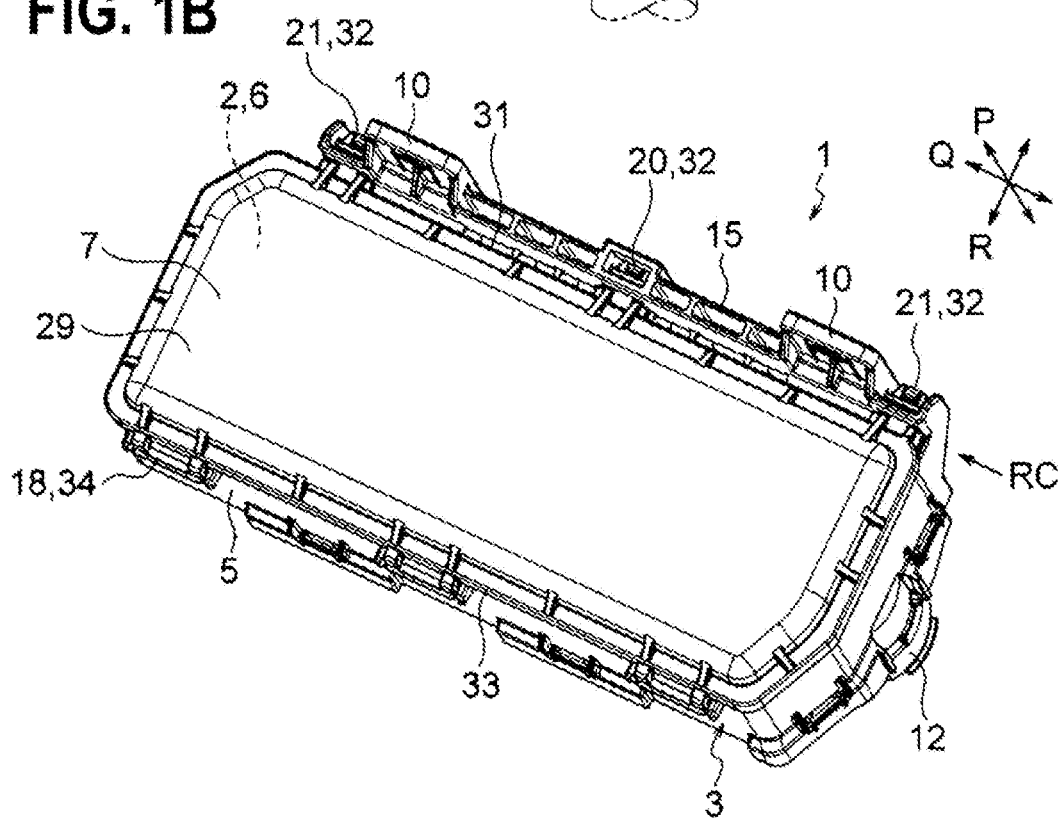
Figure 2:
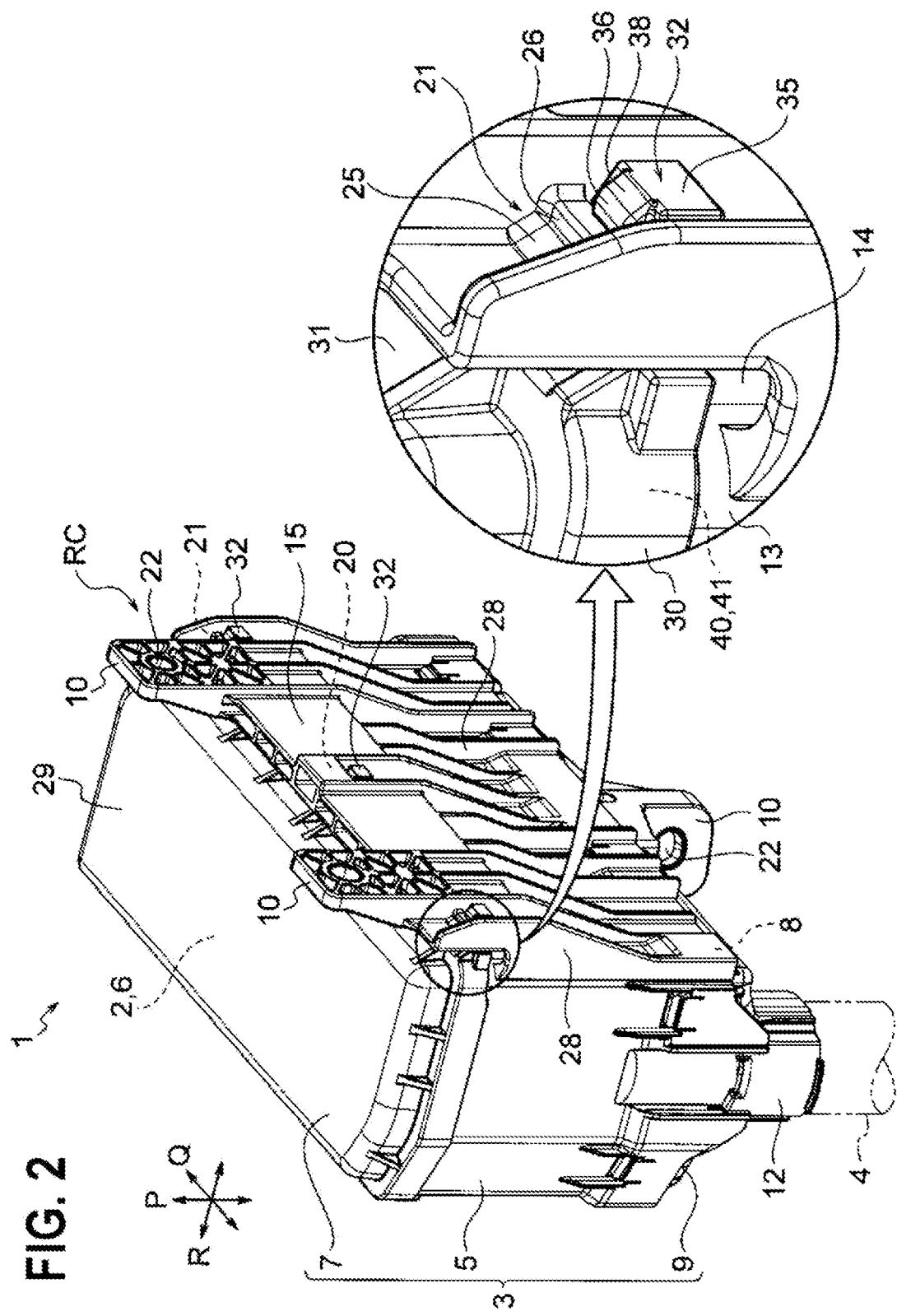
FIG. 2 is an external perspective view of the electrical connection box (an enlarged view of a main part inside the circle)
Figure 4A:
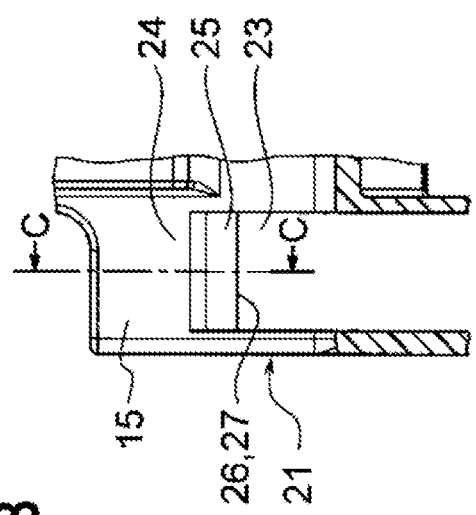
FIGS. 4A, 4B, 4C, and 4D are views of protrusion engaging portions formed in a frame.
Figure 4B:
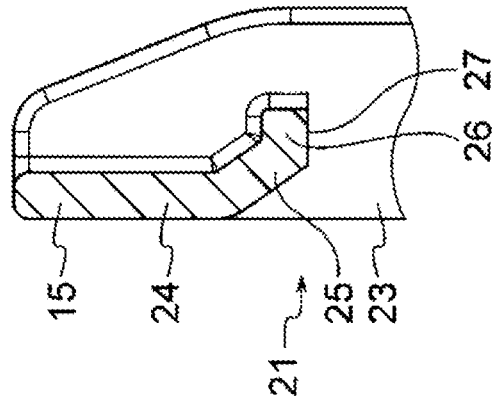
Figure 4C:
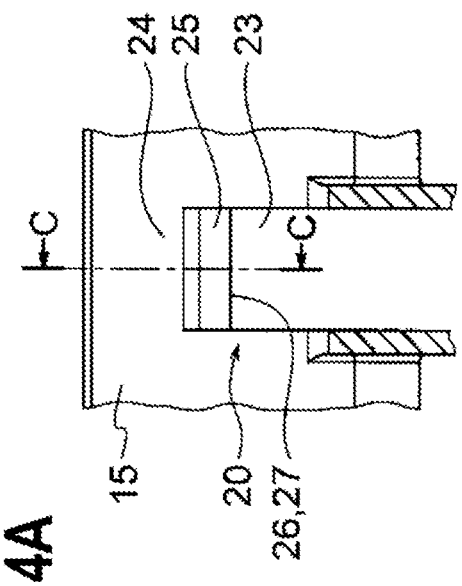
Figure 4D:
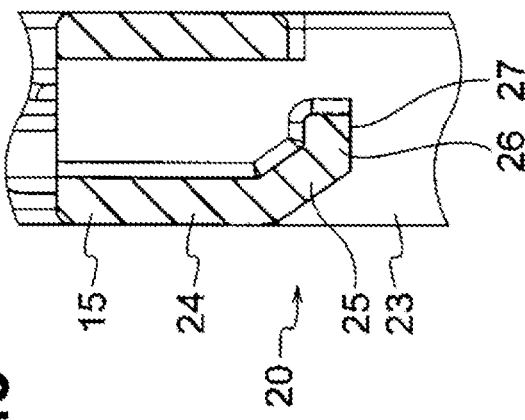
Figure 5A:
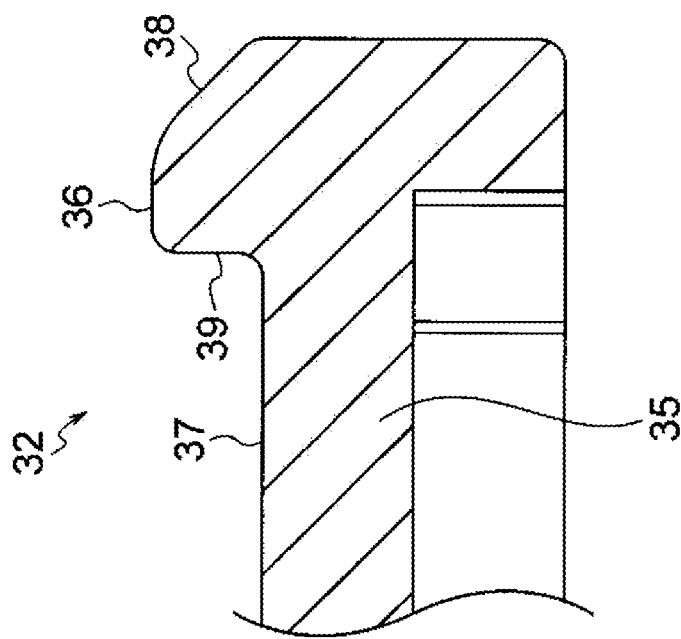
FIGS. 5A and 5B are views of a protrusion formed on the cover.
Figure 5B:
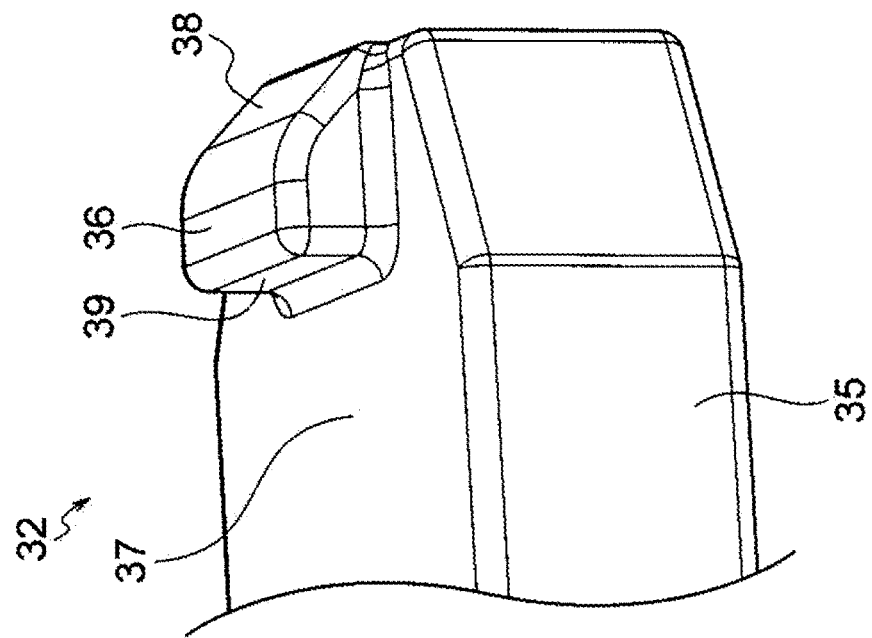
Figure 6:
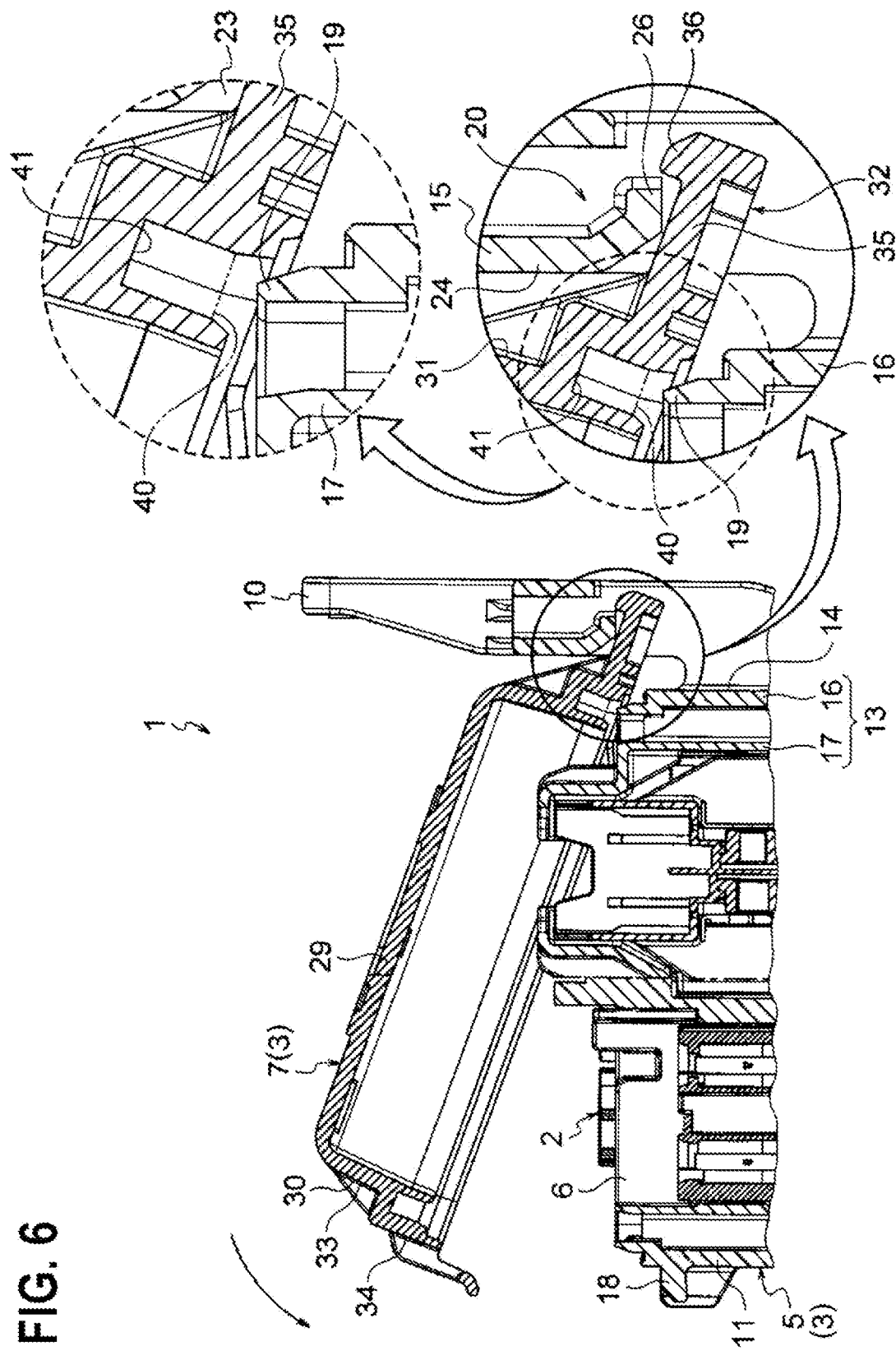
FIG. 6 is a cross-sectional view taken along the line A-A of FIG. 3 (a view at the start of cover rotation, an enlarged view of the main part inside the circle)
Figure 7:
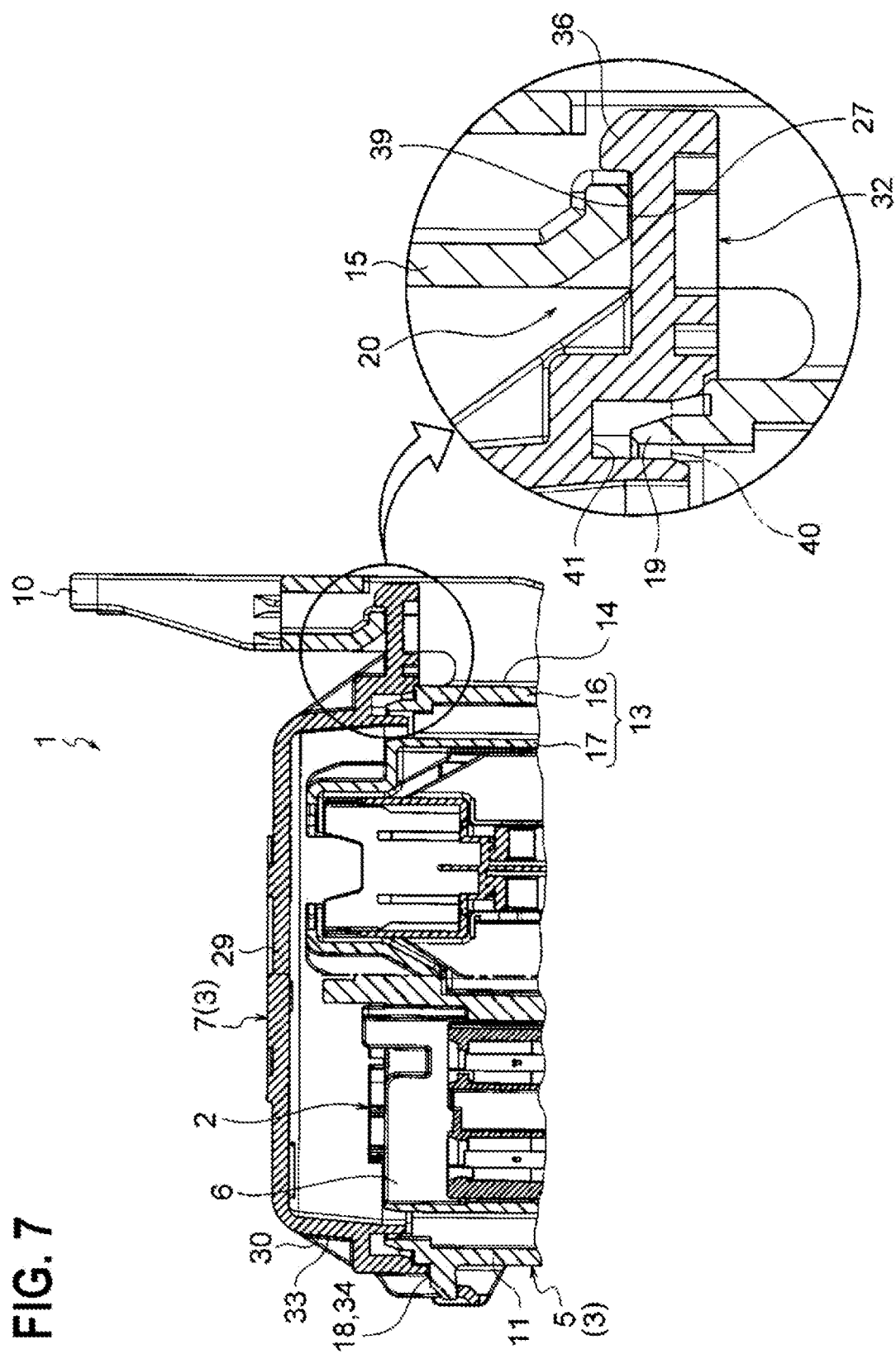
FIG. 7 is a cross-sectional view taken along the line A-A of FIG. 3 (a view when the cover is fitted, the enlarged view of the main part inside the circle)
Figure 8A:
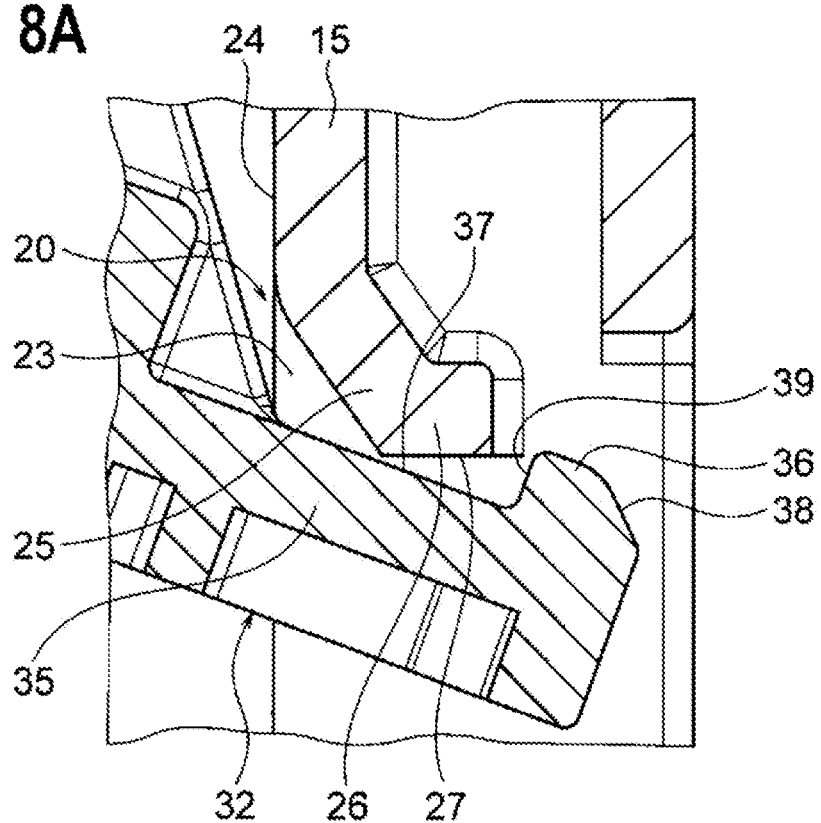
Figure 8B:
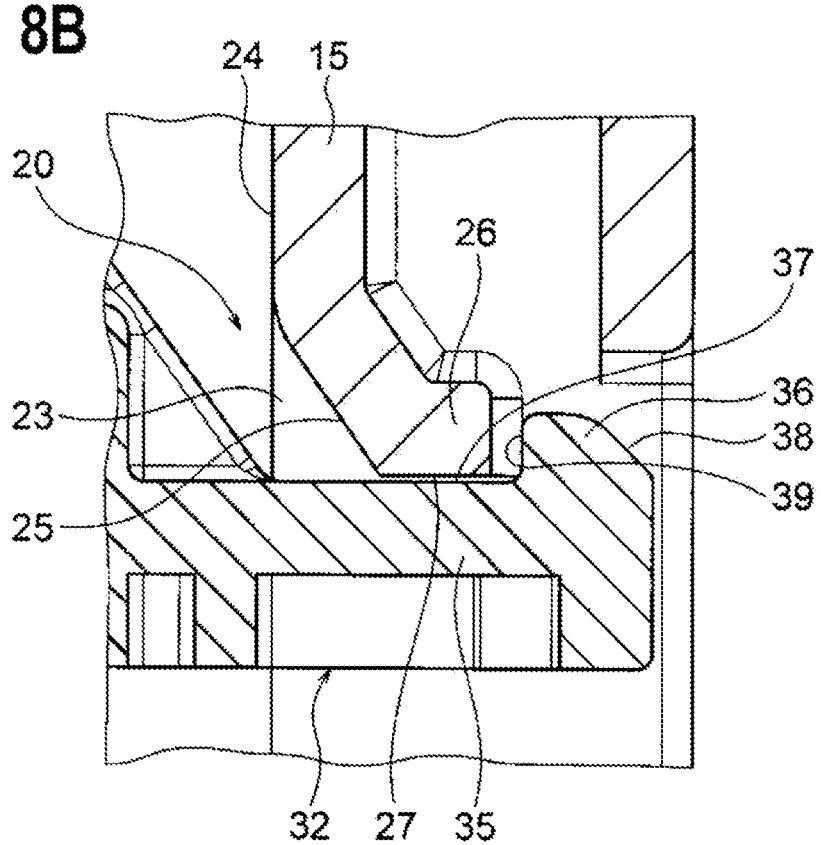

Hereinafter, Example 1 will be described with reference to drawings. FIGS. 1A, 1B, and 2 are external perspective views illustrating an embodiment of an electrical connection box including the casing of the present invention. FIG. 3 is a plan view of the electrical connection box, FIGS. 4A, 4B, 4C, and 4D are views of the protrusion engaging portions formed in the frame, FIGS. 5A and 5B are views of the protrusion formed in the cover, FIGS. 6 and 7 are sectional views taken along the line A-A of FIG. 3, and FIGS. 8A and 8B are sectional views taken along the line B-B of FIG. 3. An arrow P in the drawing indicates a vertical direction, an arrow Q indicates a left-right direction, and an arrow R indicates a front-rear direction.

<Configuration of Electrical Connection Box 1>

In FIGS. 1A and 1B to 3, an electrical connection box 1 is mounted on a truck in an exposed state to the outside (assumed to be an example). Specifically, the electrical connection box is mounted between a cabin and a loading platform in the truck (assumed to be an example). The electrical connection box 1 is configured to include an electronic component block 2 (see FIGS. 6 and 7) and a casing 3 for accommodating the electronic component block 2. The electrical connection box 1 is configured so that a wire harness 4 is retracted into the casing 3 (the wire harness 4 is provided with the electrical connection box 1 at a predetermined position of this terminal or the like and is wired to an automobile).

The electrical connection box 1 has a structure for preventing an upper cover 7 (cover) to be described later from coming off.

<Electronic Component Block 2>

In FIGS. 6 and 7, the electronic component block 2 is provided as a member to which a plurality of electronic components are assembled. The electronic component block 2 is provided as a member to which the electronic components are connected to a predetermined circuit. Specifically, a relay assembled to a relay assembling portion (reference numeral omitted) made of resin and a fuse assembled to a fuse assembling portion (reference numeral omitted) made of resin can be provided as members (the configuration of the electronic component block 2 is assumed to be an example).

The electronic component block 2 as described above is one of a cassette type and is detachably assembled to a frame 5 to be described later. For the electronic component block 2, this name may be read as a cassette block 2.

<Configuration of Casing 3>

In FIGS. 1A and 1B to 6, the casing 3 is a combination of members made of resin having insulation properties and specifically, is configured to include the frame 5 to which the electronic component block 2 is detachably assembled, the upper cover 7 (cover) for covering an upper opening portion 6 (opening portion) of the frame 5, and a lower cover 9 for covering a lower opening portion 8 of the frame 5. The casing 3 is provided with a pair of fixed leg portions 10 and a single fixed leg portion 10. The casing 3 is provided with an insertion portion 12 through which the wire harness 4 is inserted (retracted).

The upper opening portion 6 (opening portion) is an opening portion surrounded by an edge 19 of an outer peripheral wall 16 constituting a frame peripheral wall 13 to be described later. The upper opening portion 6 is an opening portion at a position on the upper side in the drawing and is also an opening portion on the side of the upper cover 7 (cover).

<Configuration of Frame 5>

In FIGS. 1A and 1B, 2, 6, and 7, the frame 5 is a resin-molded product having a frame peripheral wall 13, a fixed base 15 provided on one side portion 14 of the frame peripheral wall 13, and the pair of fixed leg portions 10 provided on the fixed base 15 and is formed in the illustrated shape.

<Frame Peripheral Wall 13>

FIGS. 1A and 1B, 2, 6, and 7, the frame peripheral wall 13 has the outer peripheral wall 16 extending in the vertical direction of the arrow P and having this height and an inner peripheral wall 17 disposed inside the outer peripheral wall 16 and is formed in a frame-shaped portion whose top and bottom are opened. The frame peripheral wall 13 is formed with a double-wall structure in the present example. The fixed base 15 as described above is provided on one side portion 14 of the frame peripheral wall 13. Three locking portions 18 as fitting portions to the upper cover 7 are provided on the other side portion 11 to be the opposite side of one side portion 14 (the number of locking portions is assumed to be an example). A well-known structure is adopted for the locking portions 18, and a detailed description thereof will be omitted here. On the inner surface of the inner peripheral wall 17, a mounting portion (not illustrated) for the electronic component block 2 is formed. The reference numeral 19 in the frame peripheral wall 13 indicates the edge of the outer peripheral wall 16. The edge 19 is equivalent to the "edge" described in the claims.

<Fixed Base 15 and Fixed Leg Portion 10>

In FIGS. 2, 3, 6, and 7, the fixed base 15 is provided on one side portion 14 of the frame peripheral wall 13 as described above. The fixed base 15 is provided on the upper side of one side portion 14 and is formed in a shape extending in the left-right direction. The fixed base 15 is disposed in accordance with the position of a rotation center RC of the upper cover 7 (cover). In such the fixed base 15, in addition to the pair of fixed leg portions 10, three protrusion engaging portions 20, 21, and 21 are formed (the number of protrusion engaging portions is assumed to be an example). In the present example, the protrusion engaging portion 20 is disposed at the center position in the left-right direction of the fixed base 15, and the protrusion engaging portions 21 and 21 are disposed at the left end and the right end. The pair of fixed leg portions 10 are disposed next to the protrusion engaging portions 21 and 21. A bolt insertion hole 22 through which a fixing bolt (not illustrated) is inserted is formed through the pair of fixed leg portions 10.

<Protrusion Engaging Portion 20 and Pair of Protrusion Engaging Portions 21>

FIGS. 2 to 4A, 4B, 4C, and 4D, the protrusion engaging portion 20 and the pair of protrusion engaging portions 21 are formed in such a portion that a protrusion 32 (described later) of the upper cover 7 (cover) is inserted and the protrusion 32 is engaged. A hole 23, a wall 24, a guide wall 25, and a holding wall 26 are formed in the protrusion engaging portion 20 and the pair of protrusion engaging portions 21 as described above.

The hole 23 is formed in a portion penetrating the fixed base 15 in the front-rear direction. Specifically, the hole 23 is formed in a portion that is opened to a size that allows insertion of the protrusion 32 to be described later. That is, the hole 23 is formed in a portion where the left and right opening widths are opened in accordance with the width of the protrusion 32, in a portion where the upper and lower opening widths are opened including the height of a projection 36 (described later) of the protrusion 32, and further in an opening portion that allows movement of the protrusion 32 in rotational movement of the upper cover 7, which will be described later.

The wall 24 is the wall itself of the fixed base 15 and is disposed on the upper side of the hole 23. When the protrusion 32 to be described later is inserted, the wall 24 is formed in such a portion that the tip of the protrusion 32 is bumped when the insertion direction is not aligned. The guide wall 25 is disposed at a boundary portion between the wall 24 and the hole 23. The guide wall 25 is formed in a portion continuous to the lower end of the wall 24 for guiding the protrusion 32 to the depth of the hole 23. The guide wall 25 is formed so as to incline diagonally rearward. The holding wall 26 is disposed at the end portion of such the guide wall 25.

The holding wall 26 is formed in a portion having a shape extending straight rearward and short. A reference numeral 27 in the holding wall 26 indicates a peripheral wall side holding surface. The peripheral wall side holding surface 27 is formed as a holding surface such that a cover side holding surface 37 (described later) of the protrusion 32 may come into contact. The peripheral wall side holding surface 27 is formed in such a portion as to press and hold the upper cover 7 in a case where the upper cover 7 is subjected to such a force as to be pushed upward, for example, and maintain the position of the upper cover 7 (the position of the protrusion 32). The peripheral wall side holding surface 27 is disposed and formed at a position substantially flush with the edge 19 of the outer peripheral wall 16 (see FIG. 7).

When viewed from the rear side of the electrical connection box 1, the protrusion engaging portion 20 and the pair of protrusion engaging portions 21 as described above are in such a state that the left and right are protected by a plurality of longitudinal ribs 28 protruding from one side portion 14 of the frame peripheral wall 13.

<Configuration of Upper Cover 7 (Cover)>

FIGS. 1A and 1B to 3, the upper cover 7 is a resin-molded product for covering the upper opening portion 6 (opening portion) of the frame 5 as described above, having a ceiling wall 29, a cover peripheral wall 30 continuous to the peripheral edge of the ceiling wall 29, three protrusions 32 provided on one side portion 31 of the cover peripheral wall 30 (the number of protrusions is assumed to be an example), and three locking portions 34 provided on the other side portion 33 on the opposite side of one side portion 31 (the number of locking portions is assumed to be an example) and is formed in the illustrated shape. As may be seen from the drawing, the upper cover 7 is a separate member from the frame 5. A known structure is adopted for the ceiling wall 29, the cover peripheral wall 30, and the locking portions 34, so a detailed description thereof will be omitted here.

<Protrusion 32>

FIGS. 2, 3 and 5A and 5B, the three protrusions 32 are disposed and formed in accordance with the positions of the protrusion engaging portion 20 and the pair of protrusion engaging portions 21 of the frame peripheral wall 13. The three protrusions 32 are disposed and formed in accordance with the position of the rotation center RC (see FIG. 6) at the time of rotational movement of the upper cover 7 to be described later. When the three protrusions 32 are inserted into the protrusion engaging portion 20 and the pair of protrusion engaging portions 21 of the frame peripheral wall 13, the protrusions 32 themselves are formed in such portions as to be engaged. It is assumed that all three protrusions 32 are formed in the same shape. Therefore, only one thereof will be described below.

The protrusion 32 has a protrusion main body 35 and the projection 36 and is formed in the illustrated shape. The protrusion main body 35 is formed in a portion protruding outward from one side portion 31 of the cover peripheral wall 30. The protrusion main body 35 is formed in a portion having a relatively high strength in the upper cover 7. The protrusion main body 35 is formed in such a manner that the width in the left-right direction from the base end portion to the intermediate portion is formed to be the same, and the tip side is formed in such a portion that the corner is dropped and tapered. In the present example, the protrusion main body 35 is formed so as to be seen as a relatively thick portion. The upper surface of the protrusion main body 35 is formed flat. The upper surface is formed as a holding surface that may come into contact with the peripheral wall side holding surface 27 of the protrusion engaging portions 20 and 21. That is, the upper surface is formed as the cover side holding surface 37.

The projection 36 is formed in a substantially claw-like portion protruding upward from the upper surface of the tip of the protrusion main body 35. A guide taper 38 and a holding wall facing surface 39 are formed on the projection 36 as described above. The guide taper 38 is formed in a portion which may slidably contact the guide wall 25 of the protrusion engaging portions 20 and 21. The holding wall facing surface 39 is formed in a portion which may be hooked in opposition to the end portion of the holding wall 26 of the protrusion engaging portions 20 and 21.

<Waterproof Capability (Air Tightness) of Casing 3>

In FIGS. 6 and 7, the casing 3 is partially waterproofed (airtight). Specifically, an elastically deformable packing 40 is assembled, and the casing 3 has high waterproof capability (airtightness) in this assembled portion. As a disposition of the packing 40, an annular packing groove 41 is formed at an end portion of the cover peripheral wall 30 of the upper cover 7, and the packing 40 is assembled to the packing groove 41 so as to be disposed as illustrated. When the packing 40 is pushed against the edge 19 of the outer peripheral wall 16, the packing 40 is elastically deformed and comes into close contact with the edge 19 and the packing groove 41.

The upper cover 7 is lifted upward by the elastic restoring force of the packing 40. At this time, since the cover side holding surface 37 of the protrusion 32 contacts the peripheral wall side holding surface 27 of the protrusion engaging portions 20 and 21, the holding state of the upper cover 7 is maintained.

<Assembling of Upper Cover 7>

Assembling of the upper cover 7 will be described with reference to FIGS. 6 to 8A and 8B. First, in FIGS. 6, and 8A and 8B, assembling of the upper cover 7 is started by setting the upper cover 7 in an inclined state as illustrated in FIG. 6 and inserting the protrusion 32 of the upper cover 7 into the protrusion engaging portion 20 (21) of the fixed base 15 provided on the frame peripheral wall 13 (see FIGS. 6, and 8A and 8B). The protrusion 32 is engaged by being inserted into the protrusion engaging portion 20 (21), and the rotation center RC of the upper cover 7 is generated in the vicinity of this engaging portion (around the position of the edge 19 of the outer peripheral wall 16) (or the rotation center RC may be generated at the engaging portion).

Next, when the upper cover 7 is rotated and moved (in the case of FIG. 6, when the upper cover 7 is rotated and moved counterclockwise), the packing 40 is pressed against the edge 19 of the outer peripheral wall 16 on the side of one side portion 14 of the frame peripheral wall 13. In the present example, the position is determined by the engagement between the protrusion 32 and the protrusion engaging portion 20 (21), and the packing 40 is pressed against the edge 19 around this center position. In the middle of rotation of the upper cover 7, even if the protrusion 32 is about to fall off the protrusion engaging portion 20 (21), since the projection 36 of the protrusion 32 is hooked on the protrusion engaging portion 20 (21), the upper cover 7 is prevented from coming off.

FIGS. 7 and 8A and 8B, finally, when the locking portion 34 of the upper cover 7 is fitted to a locking portion 18 of the frame peripheral wall 13, the assembly by the rotational movement of the upper cover 7 is completed. At this time, since the packing 40 is pressed against the edge 19 of the outer peripheral wall 16 in the entire circumference, waterproof capability (airtightness) is secured. Since the protrusion 32 of the upper cover 7 is held in contact with the protrusion engaging portion 20 (21) of the frame peripheral wall 13 and the locking portions 18 and 34 are fitted to each other as described above, even in the assembled state, the upper cover 7 is prevented from coming off.

<Effect of Casing 3>

As described above with reference to FIGS. 1A and 1B to 8A and 8B, according to the casing 3 of the electrical connection box 1 which is an embodiment of the present invention, for example, during the rotational movement at the time of cover assembly, even if the protrusion 32 of the upper cover 7 is about to fall off the protrusion engaging portion 20 (21) of the frame peripheral wall 13 due to some reason, the projection 36 formed on the protrusion 32 is hooked on the protrusion engaging portion 20 (21) to restrict the falling off. As a result, it is possible to prevent the upper cover 7 from coming off.

According to the casing 3, since the cover side holding surface 37 formed on the protrusion 32 of the upper cover 7 comes into surface contact with the peripheral wall side holding surface 27 formed on the protrusion engaging portion 20 (21) of the frame peripheral wall 13 so that stable cover holding is performed, it is possible to enhance the effect of preventing the upper cover 7 from coming off.

According to the casing 3, even if the upper cover 7 is about to come off the frame peripheral wall 13 due to some reason after the upper opening portion 6 of the frame peripheral wall 13 is covered with the upper cover 7, since the cover side holding surface 37 formed on the protrusion 32 of the upper cover 7 has a disposition relationship (a relationship in which the peripheral wall side holding surface 27 is disposed and formed at a position substantially flush with the edge 19 of the outer peripheral wall 16) such that the cover side holding surface 37 surely comes into surface contact with the peripheral wall side holding surface 27 formed on the protrusion engaging portion 20 (21) of the frame peripheral wall 13, it is possible to further enhance the effect of preventing the upper cover 7 from coming off.

According to the casing 3, since the packing 40 is included as the configuration of the casing 3, it is possible to provide the casing 3 with waterproof capability (airtightness) secured. As a result, it is possible to prevent the upper cover 7 from coming off in the casing 3 that ensures this waterproof capability (airtightness).

According to the casing 3, since the cover side holding surface 37 is pressed against the peripheral wall side holding surface 27 of the frame peripheral wall 13 by the elastic restoring force by the packing 40, it is possible to make the holding state of the upper cover 7 stable and good.

According to the casing 3, since the protrusion 32 of the upper cover 7 and the protrusion engaging portion 20 (21) of the frame peripheral wall 13 are engaged at a plurality of positions, it is possible not only to make it difficult for the upper cover 7 to be removed, but also to enhance the holding state of the upper cover 7, thereby improving the waterproof capability (airtightness).

Besides this, since the above effect of the casing 3 is obtained, it is possible to provide the better electrical connection box 1 and the wire harness 4 with high reliability.

Example 2

Figure 9A:
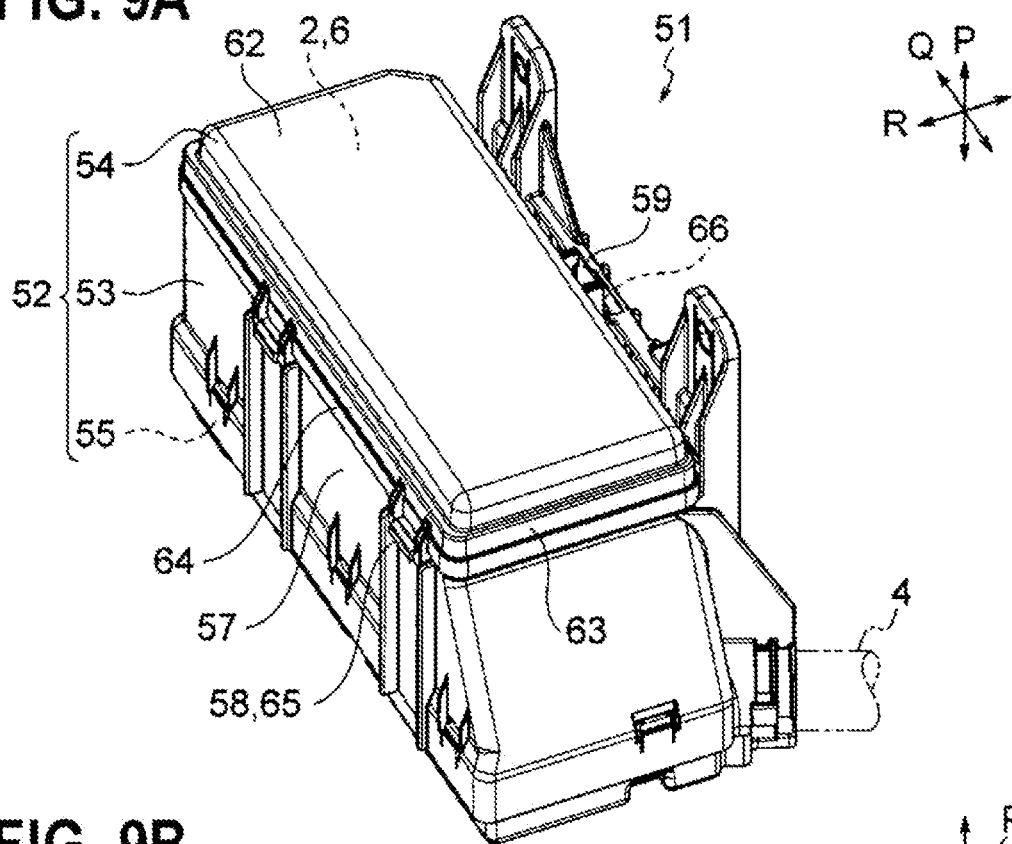
FIGS. 9A and 9B are views illustrating another embodiment of an electrical connection box including the casing of the present invention.
Figure 9B:
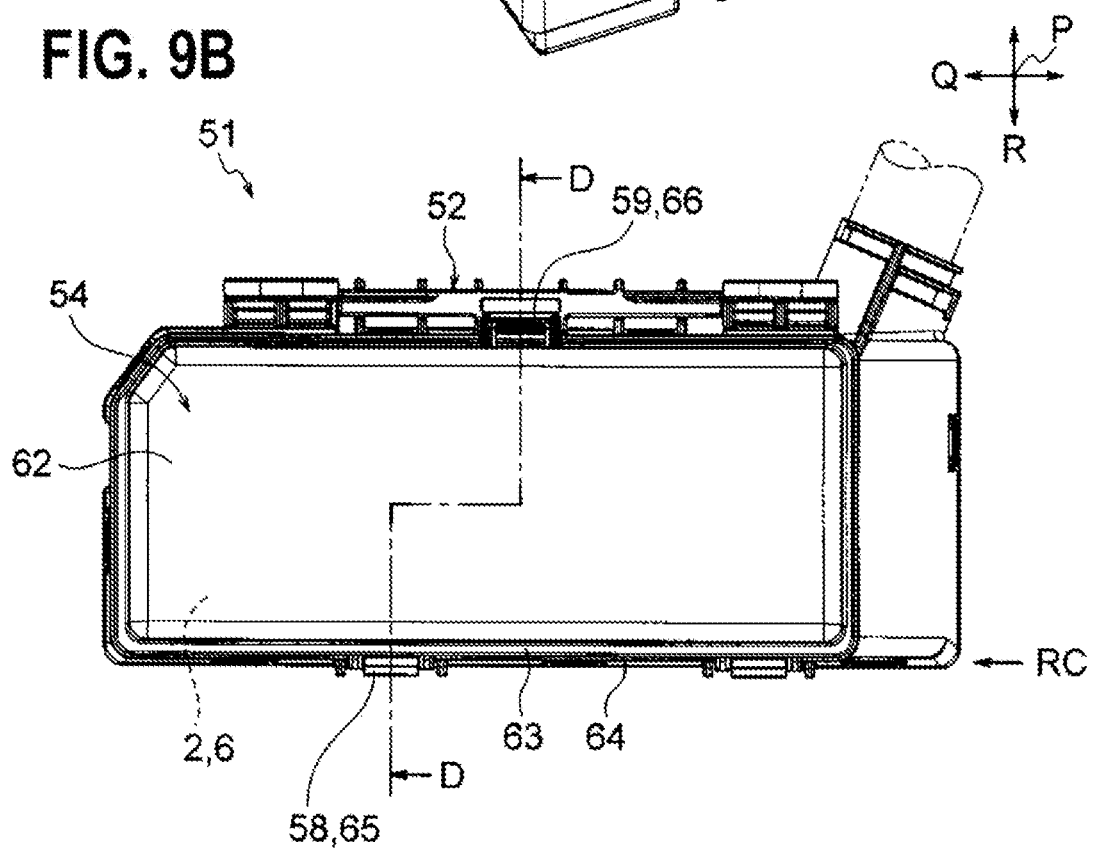
Figure 10A:
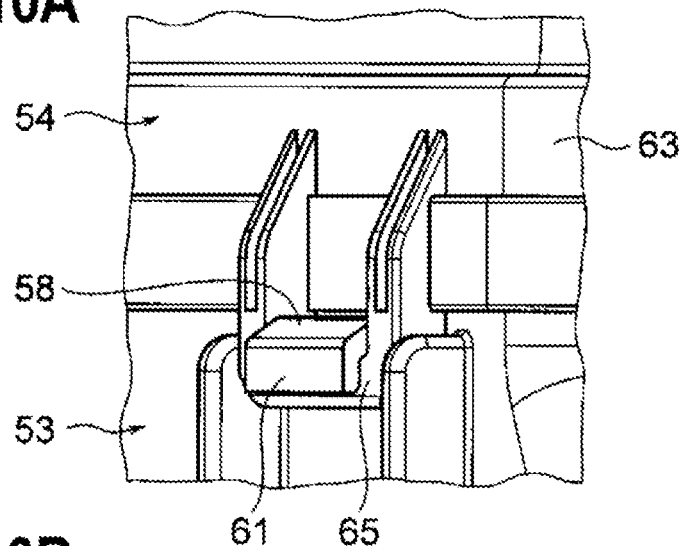
FIGS. 10A, 10B, and 10C are views of a protrusion and a protrusion engaging portion.
Figure 10B:
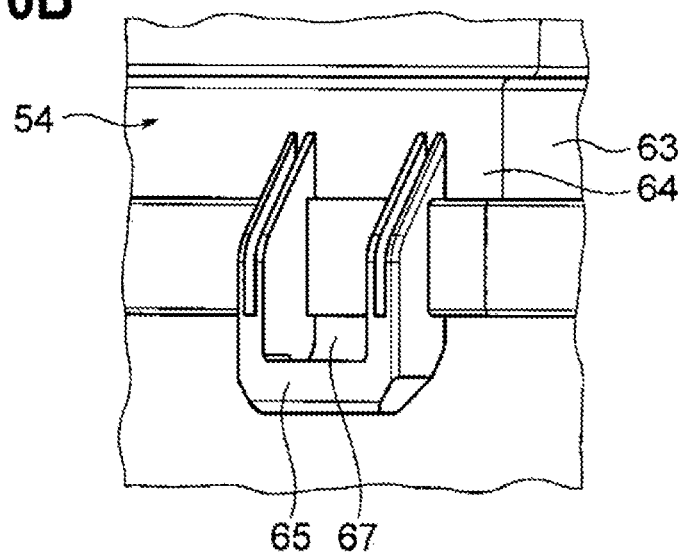
Figure 10C:
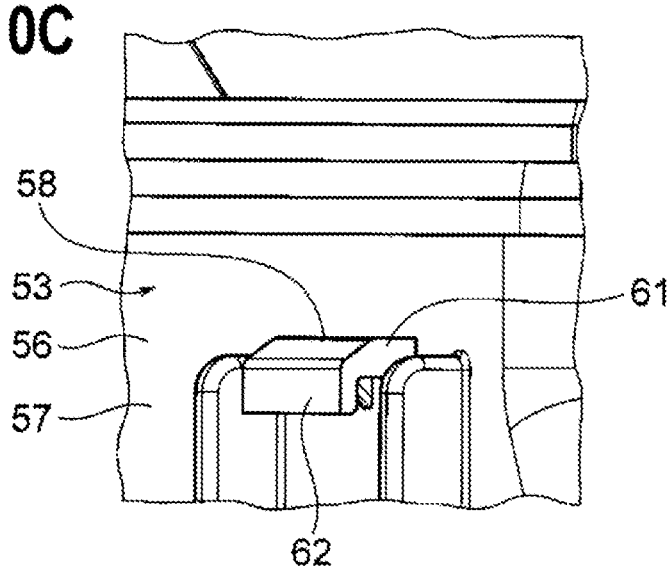

Hereinafter, Example 2 will be described with reference to drawings. FIGS. 9A and 9B are views illustrating another embodiment of an electrical connection box including the casing of the present invention. FIGS. 10A, 10B, and 10C are views of a protrusion and a protrusion engaging portion, and FIGS. 11 and 12 are cross-sectional views taken along the line D-D of FIG. 9B. Components that are basically the same as those in Example 1 are denoted by the same reference numerals, and a detailed description thereof will be omitted. The arrow P in the drawing indicates a vertical direction, the arrow Q indicates a left-right direction, and the arrow R indicates a front-rear direction.

<Configuration of Electrical Connection Box 51>

In FIGS. 9A and 9B, an electrical connection box 51 of Example 2 is configured to include an electronic component block 2 and a casing 52 for accommodating the electronic component block 2. The electrical connection box 51 is configured so that the wire harness 4 is retracted into the casing 52 (the wire harness 4 is provided with the electrical connection box 51 at a predetermined position of this terminal or the like and is wired to an automobile).

Like the electrical connection box 1 of Example 1, the electrical connection box 51 has a structure for preventing an upper cover 54 (cover) to be described later from coming off.

<Configuration of Casing 52>

In FIGS. 9A and 9B, the casing 52 is a combination of members made of resin having insulation properties and is configured to include a frame 53, the upper cover 54 (cover) for covering the upper opening portion 6 (opening portion) of the frame 53, and a lower cover 55 for covering the lower opening portion of the frame 53.

<Frame 53>

In FIGS. 9A and 9B, the frame 53 is a resin-molded product having a frame peripheral wall 56 and is formed in the illustrated shape. On one side portion 57 of the flame peripheral wall 56, two protrusions 58 protruding outward are formed (the number of protrusions is assumed to be an example). The protrusions 58 are disposed in accordance with the position of the rotation center RC related to the rotational movement of the upper cover 54. One locking portion 59 as a fitting portion to the upper cover 54 is provided on the other side portion to be the opposite side of one side portion 57 (the number of locking portions is assumed to be an example).

<Protrusion 58>

In FIGS. 9A and 9B, and 10A, 10B, and 10C, the protrusion 58 is formed in a shape protruding outward as described above. The protrusion 58 has a protrusion main body 60 and a projection 61 and is formed in the illustrated shape. The lower surface of the protrusion main body 60 is formed flat. The projection 61 is formed in a substantially claw-like portion protruding downward from the lower surface of the tip of the protrusion main body 60. The projection 61 is formed as a portion to be hooked on a protrusion engaging portion 65 (described later) of the upper cover 54.

<Upper Cover 54>

In FIGS. 9A and 9B, the upper cover 54 is a resin-molded product having a ceiling wall 62, a cover peripheral wall 63 continuous to the peripheral edge of the ceiling wall 62, two protrusion engaging portions 65 provided on one side portion 64 of the cover peripheral wall 63 (the number of protrusions is assumed to be an example), and one locking portion 66 provided on the other side portion on the opposite side of one side portion 64 (the number of locking portions is assumed to be an example) and is formed in the illustrated shape. As may be seen from the drawing, the upper cover 55 is a separate member from the frame 53.

<Protrusion Engaging Portion 65>

In FIGS. 9A and 9B to 12, the protrusion engaging portion 65 is formed in such a portion as to be inserted into the protrusion 58 of the frame peripheral wall 56 to be engaged. The protrusion engaging portion 65 has a hole 67 and is formed in a U-shaped frame shape. The protrusion engaging portion 65 is formed downward. The protrusion engaging portion 65 basically has rigidity, but since the upper cover 54 with the above shape is a resin-molded product, the protrusion engaging portion 65 has slight flexibility to the outside.

<Assembling of Upper Cover 54>

Assembling of the upper cover 54 will be described with reference to FIGS. 9A and 9B to 12. First, the upper cover 54 is set in an inclined state, and the protrusion engaging portion 65 of the upper cover 54 is inserted into the protrusion 58 of the frame peripheral wall 56. At this time, the protrusion engaging portion 65 is engaged by being inserted into the protrusion 58.

Next, when the upper cover 54 is rotated and moved in the direction of the arrow, and thereafter, the locking portion 66 of the upper cover 54 is fitted to the locking portion 59 of the frame peripheral wall 56, the assembly by rotational movement of the upper cover 54 is completed. Even if the protrusion engaging portion 65 is about to fall off the protrusion 58 in the middle of rotation of the upper cover 54, the projection 61 of the protrusion 58 is hooked on the protrusion engaging portion 65, whereby the falling off is restricted, and the coming off of the upper cover 54 is prevented. Since the locking portions 59 and 66 are fitted to each other in the assembled state and falling off of the protrusion engaging portion 65 from the protrusion 58 is restricted, even in this state, coming off of the upper cover 54 is prevented.

<Effect of Casing 52>

As described above with reference to FIGS. 9A and 9B to 12, according to the casing 52 of the electrical connection box 51 which is another embodiment of the present invention, for example, during the rotational movement at the time of cover assembly, even if the protrusion engaging portion 65 of the upper cover 54 is about to fall off the protrusion 58 of the frame peripheral wall 56 for some reason, the projection 61 formed on the protrusion 58 is hooked on the protrusion engaging portion 65 to restrict the falling off. As a result, it is possible to prevent the upper cover 54 from coming off.

Example 3

Figure 13B:
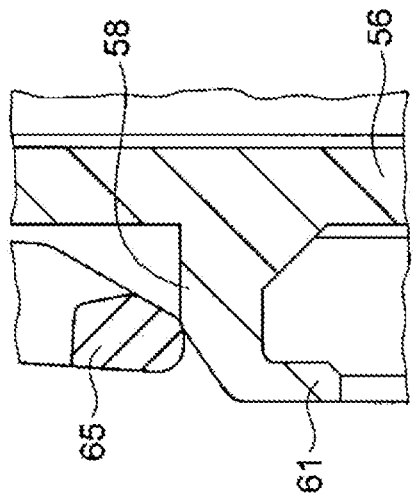
FIGS. 13A, 13B, and 13C are views illustrating still another embodiment of an electrical connection box including the casing of the present invention.
Figure 13C:
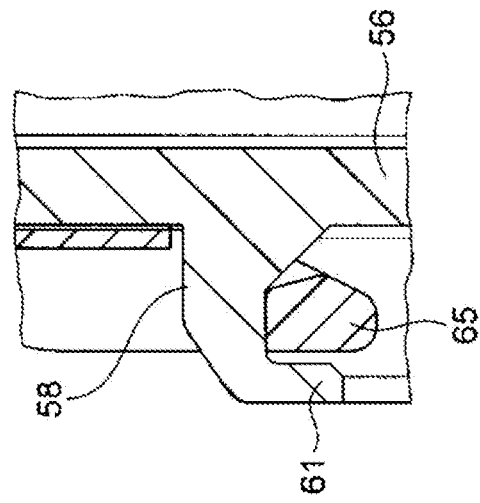
Figure 13A:
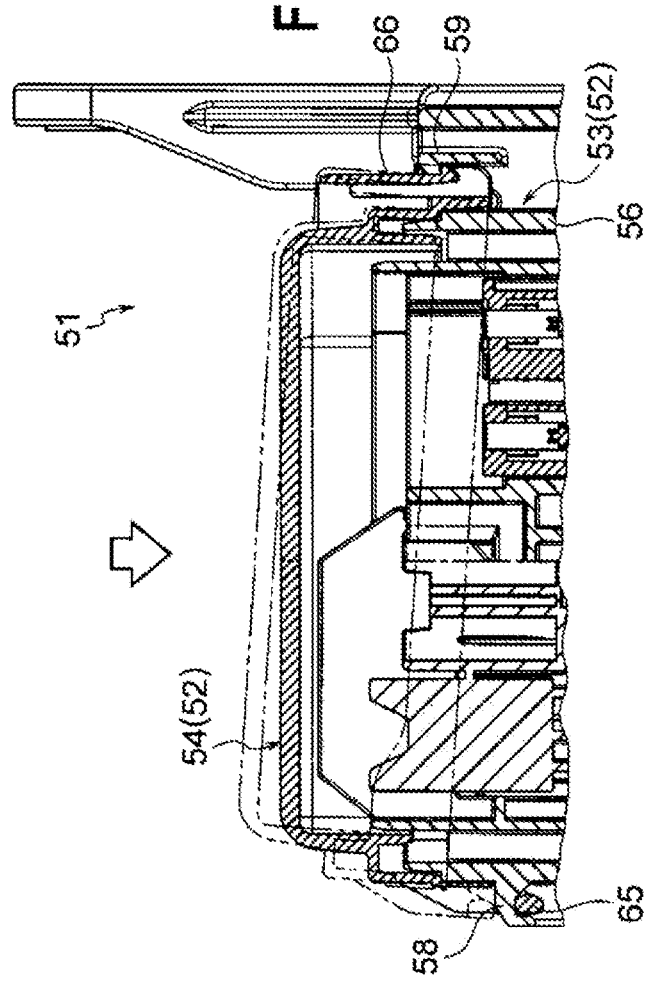

Hereinafter, Example 3 will be described with reference to drawings. FIGS. 13A, 13B, and 13C are views illustrating still another embodiment of an electrical connection box including the casing of the present invention. The arrow P in the drawing indicates a vertical direction, the arrow Q indicates a left-right direction, and the arrow R indicates a front-rear direction.

<Electrical Connection Box 51>

In FIGS. 13A, 13B, and 13C, the electrical connection box 51 of Example 3 has the same configuration and structure as the electrical connection box 51 of Example 2. For example, Example 3 corresponds to a case where the frame peripheral wall 56 and the upper cover 54 are fitted via the locking portions 59 and 66, but the protrusion engaging portion 65 of the upper cover 54 comes off the protrusion 58 of the frame peripheral wall 56 from the beginning (from the time of assembling) for some reason (or corresponds to a case where the upper cover 54 is simply placed on the frame peripheral wall 56 and is knocked to be assembled without rotating and moving the upper cover 54).

In the case of Example 3, if the upper cover 54 is knocked, for example, from above and the protrusion engaging portion 65 is elastically deformed by the action so as to climb over the protrusion 58, the upper cover 54 is forcibly assembled. If the upper cover 54 may be assembled, even if the protrusion engaging portion 65 is about to fall off the protrusion 58, since the falling off is restricted when the projection 61 is hooked on the protrusion engaging portion 65, it is possible to prevent the upper cover 54 from coming off as in Example 2.

In Example 3, it is assumed that one side portion 57 of the frame peripheral wall 56 corresponds to "the other side portion" described in the claims. Similarly, it is assumed that one side portion 64 of the upper cover 54 corresponds to "the other side portion".

In addition, it goes without saying that the present invention may be variously modified within a range not changing the gist of the present invention.

What is claimed is:

1. A casing comprising:
a frame peripheral wall on which an opening portion is formed at an edge; and
a cover that is a separate component from the frame peripheral wall and covers the opening portion by rotational movement,
wherein a protrusion protruding outward is formed on one side portion of the cover to be disposed in accordance with a position of a rotation center related to the rotational movement,
a protrusion engaging portion to be engaged by inserting the protrusion is formed on one side portion of the frame peripheral wall,
the protrusion is integrally formed with a projection that is hooked on the protrusion engaging portion in a direction of pulling out from the protrusion engaging portion, and
the projection is formed in a claw-shape protruding upward from an upper surface of a tip of the protrusion.

2. The casing according to claim 1, wherein
a cover side holding surface for holding is formed in the protrusion and is disposed between one side portion of the cover and the projection, and
a peripheral wall side holding surface for holding that allows the cover side holding surface to be contacted is formed in the protrusion engaging portion.

3. The casing according to claim 2, wherein
the protrusion engaging portion is formed so that the peripheral wall side holding surface is disposed at a position substantially flush with the edge of the frame peripheral wall.

4. The casing according to claim 2, wherein
an annular packing groove is formed in the cover, and
a packing which is elastically deformable by being pressed against the edge is assembled to the packing groove.

5. The casing according to claim 4, wherein
the projection and the protrusion engaging portion are also formed as positioning portions for determining positions of the edge and the packing at the time of the rotational movement.

6. The casing according to claim 4, wherein
a plurality of the protrusions and the protrusion engaging portions are formed in the casing.

7. An electrical connection box comprising:
an electronic component block to which a plurality of electronic components are assembled; and
the casing according to claim 1 to be an assembly destination of the electronic component block.

8. A wire harness wired to a vehicle comprising the electrical connection box according to claim 7 at a terminal.

9. A casing comprising:
a frame peripheral wall on which an opening portion is formed at an edge; and
a cover that is a separate component from the frame peripheral wall and covers the opening portion by rotational movement,
wherein a protrusion protruding outward is formed on one side portion of the frame peripheral wall to be disposed in accordance with a position of a rotation center related to the rotational movement,
a protrusion engaging portion to be engaged by being inserted into the protrusion is formed on one side portion of the cover,
the protrusion is integrally formed with a projection to be hooked on the protrusion engaging portion in a direction of pulling out from the protrusion engaging portion, and
the projection is formed in a claw-shape protruding downward from a lower surface of a tip of the protrusion.

10. An electrical connection box comprising:
an electronic component block to which a plurality of electronic components are assembled; and
the casing according to claim 9 to be an assembly destination of the electronic component block.

11. A wire harness wired to a vehicle comprising the electrical connection box according to claim 10 at a terminal.

12. A casing comprising:
a frame peripheral wall on which an opening portion is formed at an edge; and
a cover which is a separate component from the frame peripheral wall and covers the opening portion,
wherein locking portions as fitting portions are formed on one side portion of the frame peripheral wall and one side portion of the cover, respectively,
a protrusion protruding outward is formed on another side portion to be the opposite side of one side portion of the frame peripheral wall,
a protrusion engaging portion that is elastically deformable so as to climb over the protrusion and is engaged by being inserted into the protrusion is formed on another side portion to be the opposite side of one side portion of the cover,
the protrusion is integrally formed with a projection to be hooked on the protrusion engaging portion in a direction of pulling out from the protrusion engaging portion, and
the projection is formed in a claw-shape protruding downward from a lower surface of a tip of the protrusion.

13. An electrical connection box comprising:
an electronic component block to which a plurality of electronic components are assembled; and
the casing according to claim 12 to be an assembly destination of the electronic component block.

14. A wire harness wired to a vehicle comprising the electrical connection box according to claim 13 at a terminal.

* * * * *